United States Patent
Kawata

(10) Patent No.: US 7,030,628 B2
(45) Date of Patent: Apr. 18, 2006

(54) METHOD AND DEVICE FOR EVALUATING CHARGE POTENTIAL

(75) Inventor: Sadao Kawata, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 111 days.

(21) Appl. No.: 10/824,010

(22) Filed: Apr. 14, 2004

(65) Prior Publication Data

US 2004/0207411 A1    Oct. 21, 2004

(30) Foreign Application Priority Data

Apr. 15, 2003    (JP) .............................. 2003-110847

(51) Int. Cl.
    *G01R 27/26*    (2006.01)
(52) U.S. Cl. .................................... 324/663
(58) Field of Classification Search ................. 324/663
    See application file for complete search history.

(56) References Cited

U.S. PATENT DOCUMENTS 5,262,730 A * 11/1993 Smith et al. ................. 324/650

FOREIGN PATENT DOCUMENTS

JP    2002-252072    9/2002

* cited by examiner

*Primary Examiner*—Anjan Deb
*Assistant Examiner*—John Teresinski
(74) *Attorney, Agent, or Firm*—Brinks Hofer Gilson & Lione

(57) ABSTRACT

In a charge potential evaluation device, the measured value of a potential difference $V_c$ in a charged plate monitor (CPM) is converted into a potential difference $V_h$ between the conductive pattern and load beam in a head gimbal assembly (HGA), using the following expression (1), $$V_h = \frac{d_h}{\varepsilon_h} \cdot \frac{\varepsilon_c}{d_c} V_c \qquad \text{[Expression 1]}$$

where $d_h$ denotes the distance between the conductive pattern and the load beam in the HGA, $d_c$ denotes the distance between the conductive plate and a grounded surface in the CPM, $\varepsilon_h$ denotes the relative permittivity of an insulating foundation layer in the HGA, and $\varepsilon_c$ denotes the relative permittivity of the region between the conductive plate and the grounded surface in the CPM.

21 Claims, 9 Drawing Sheets

FIG. 6A
FIG. 6B
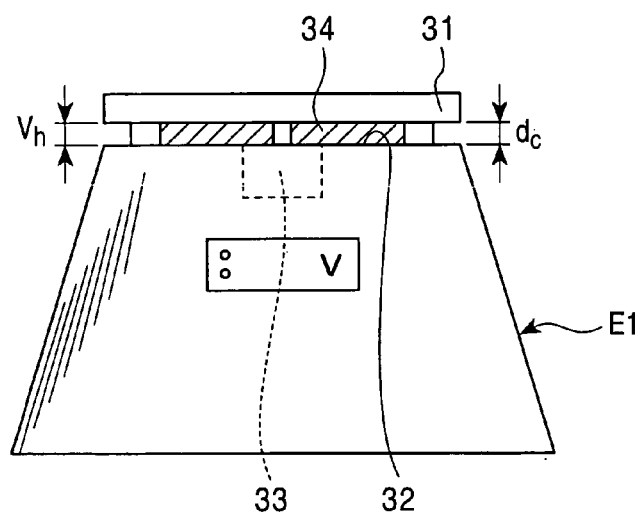
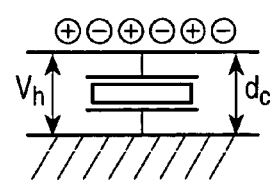
FIG. 7A
FIG. 7B
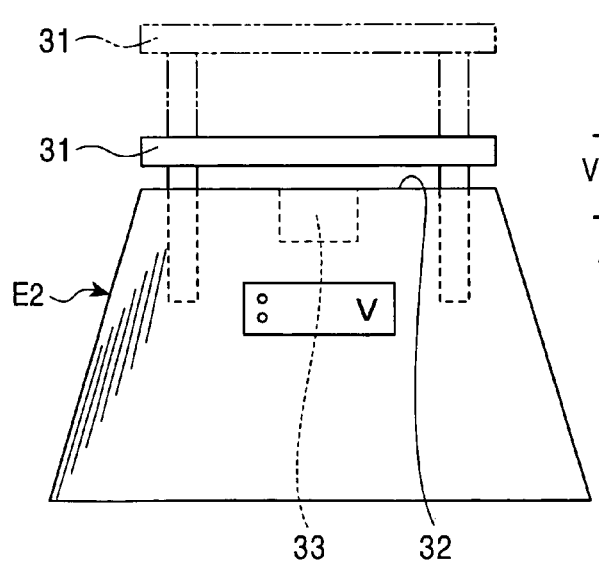
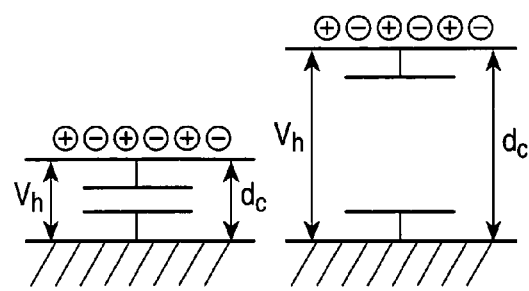

METHOD AND DEVICE FOR EVALUATING CHARGE POTENTIAL

BACKGROUND OF THE INVENTION

1. Field of the Invention

The present invention relates to a method and device for evaluating a charge potential generated by an electrification charge, of an object to be measured that has a first conductor and a second conductor opposed to each other with a dielectric therebetween.

2. Description of the Related Art

In order to reduce product defects caused by static electricity in a product assembling process, a destaticizing device is used. Destaticizing devices includes an ionizer.

The ionizer is used for ionizing water, carbon dioxide and others in the atmosphere by corona discharge, ultraviolet rays, radiation or the like to thereby apply these produced ions to a place to be destaticized using a fan or the like, thereby neutralizing electric charges.

It is necessary for all ions produced by the ionizer to be composed of positive ions and negative ions that are preferably equal in amount to each other.

The typical ion balance evaluation with respect to an ionizer is performed by using a charged plate monitor (CPM) 3 as shown in FIG. 1. In the CPM 3, the top surface of its support 5 is a grounded surface 6 that is electrically grounded. The CPM 3 has a metal plate 4 provided in a position apart from the grounded surface 6 by a predetermined distance, and measures a potential difference between the metal plate 4 and the grounded surface 6 using a noncontact potentiometer 7.

The shape of the metal plate 4 is a square 15.24 cm (6 inches) on a side. The distance between the metal plate 4 and the grounded surface 6 is defined so that the metal plate 4 and the grounded surface 6 form together a capacitor having a capacity of 20 pF with air used as its dielectric. Specifically, the distance between the metal plate 4 and the grounded surface 6 is approximately 2 cm.

When the metal plate 4 in the CPM 3 is charged, a potential difference in accordance with a charge amount of the metal plate 4 is detected.

A typical method for ion balance evaluation with respect to an ionizer will be described below.

As shown in FIG. 1, ions flowing out of the opening 2 of the ionizer 1 are applied to the metal plate 4 in the CPM 3, serving as an ionizer evaluation device, and thereby the metal plate 4 is charged.

When positive ions and negative ions that are equal in amount to each other are present in all ions produced by the ionizer, the metal plate 4 is in an electrically neutralized state, and the output of the potentiometer 7 exhibits 0 volt. When the amount of positive ions is larger than that of negative ions, the metal plate 4 is positively charged, and the output of the potentiometer 7 is positive. Conversely, when the amount of negative ions is larger than that of positive ions, the metal plate 4 is negatively charged, and the output of the potentiometer 7 is negative. The higher the ratio of either of positive ions and negative ions with respect to the other ions, that is, the worse the ion balance of the ionizer, the larger becomes the absolute value of output of the potentiometer 7.

Ionizers are disclosed in patent documents, including Japanese Unexamined Patent Application Publication No. 2002-252072.

The ionizer is used for electrically neutralizing surface charges of products in the production process of magnetic heads used for record reproduction in hard disks and the like.

The thin film magnetic element used for record reproduction in a hard disk or the like is a composite type thin film magnetic element comprising a magnetoresistive effect element for reproduction and an inductive element for recording. Such a thin film magnetic element is accommodated in a slider 10 shown in FIG. 2. The slider 10 is attached to the front end 11a of a load beam 11 formed of a leaf spring via a flexure (not shown). The load beam 11 with the slider 10 attached thereto is referred to as a "head gimbal assembly (HGA)".

The magnetoresistive effect element for reproduction is connected to a conductive pattern 13 constituted of a conductive material such as Cu. An insulating foundation layer 12 constituted of polyimide is provided between the conductive pattern 13 and the load beam 11. Also, a protective layer 14 constituted of polyimide is formed over the conductive pattern 13. The load beam 11 is grounded via a jig in the production process.

In FIG. 2, the conductive pattern of the inductive element is omitted from illustration. On the other hand, the magnetoresistive effect element (MR element) M is schematically illustrated in FIG. 2.

As described above, since the conductive pattern 13 and the load beam 11 are opposed to each other with the insulating foundation layer 12 therebetween, the conductive pattern 13, the insulating foundation layer 12, and the load beam 11 form together a capacitor.

When the protective layer 14 constituted of polyimide is charged by friction or the like, an electric charge occurs also in the conductive pattern 13, and a potential difference is generated between the conductive pattern 13 and the load beam 11. In this situation, when one of pads 13 a of the conductive pattern 13 is connected to the ground, an instantaneous current (discharge current) flows through the MR element M. If this discharge current is too high, the MR element M will be destructed. As a result, an open state will be brought about between the electrodes of the MR element, or the MR element M will come to exhibit an electric resistance value other than a predetermined resistance value.

The resistance of the HGA against discharge currents (i.e., electrostatic discharge resistance; ESD resistance) can be measured by using the device (charged device model; CDM) shown in FIG. 15.

The charged device model 17 has a power supply C capable of varying the supply voltage. One of the pads for supplying sense currents to the MR element in the HGA 18 is connected to a changeover switch S. First, the changeover switch is connected to a terminal S1 to connect it to a negative terminal of the power supply C, thereby charging the HGA. Next, the changeover switch S is connected to a terminal S2 to instantaneously pass the electric charges accumulated in the HGA to the ground, thereby passing discharge currents. While varying the charge voltage with respect to the HGA by varying the supply voltage of the power supply C, the above-described measurement is repeated. The minimum charge voltage that causes damage to the MR element to thereby bring about disturbances to reproduction signals is assumed to be an ESD withstand voltage of the HGA.

In a hard disk production step, for example, in an HGA step, the MR element must be controlled so as not to be subjected to a voltage of not less than the ESD withstand voltage, and for this purpose, the ionizer can be used. In other words, the surface charges of HGA are electrically neutralized by using the ionizer, and thereby the HGA is controlled so as not to be subjected to a voltage of not less than the ESD withstand voltage.

The surface charge of the HGA neutralized by the ionizer may reflect the ion balance of the ionizer. If the ion balance of the ionizer tips toward either of positive and negative ions, the surface charges will also lean to either of the positive and negative polarities, thereby causing a potential difference between the conductive pattern 13 and the load beam 11.

It is therefore necessary to adjust the ion balance of the ionizer so that the HGA is not subjected a voltage of not less than the ESD withstand voltage thereof.

Here, the evaluation criterion for the ion balance of the ionizer becomes a subject of discussion. Conventionally, the ion balance of the ionizer has been represented by the value of voltage display of the CPM, and has been adjusted so that the value of voltage display becomes lower than the voltage representing the ESD resistance of the HGA that has been obtained using the charged device model (CDM).

The CPM 3 shown in FIG. 1 is a capacitor having a capacitor of 20 pF with air used as its dielectric. On the other hand, in the capacitor that the conductive pattern 13, insulating foundation layer 12, and load beam 11 of the HGA shown in FIG. 2 form together, the insulating foundation layer 12 serving as a dielectric is constituted of polyimide, having a relative permittivity higher than that of air. In addition, the distance between the conductive pattern 13 and the load beam 11 is in the range of 10 to 20 μm, which is significantly less than the distance between the metal plate 4 and the grounded surface 6 in the CPM, i.e., approximately 2 cm. Therefore, the capacity of the capacitor that the conductive pattern 13, insulating foundation layer 12, and load beam 11 of the HGA form together, is remarkably different from the capacity of the CPM.

Therefore, when adjusting the ion balance of the ionizer in order to control the production process so that the HGA is not subjected to a voltage of not less than the ESD withstand voltage thereof, whether it is an appropriate method to regulate the value of voltage display to a value of not more than that of the voltage representing the ESD resistance of the HGA, comes to an issue.

SUMMARY OF THE INVENTION

Accordingly, it is an object of the present invention to provide a method and device for evaluating a charge potential generated, by an electrification charge, between a first conductor and a second conductor in an object to be measured that has the first and second conductors opposed to each other with a dielectric therebetween.

In an aspect, the present invention provides a charge potential evaluation method that includes (a) a step of acquiring, in an object to be measured that has a first conductor and a second conductor opposed to each other with a dielectric therebetween, the value of the relative permittivity of the dielectric and the distance between the pair of conductors; (b) a step of measuring, in a predetermined atmosphere, the potential $V_c$ of a conductive plate facing a grounded surface with a predetermined distance therebetween; and (c) a step of converting the potential difference $V_h$ between the first conductor and the second conductor in the object to be measured in the atmosphere, using the following expression (4).

$$V_h = \frac{d_h}{\varepsilon_h} \cdot \frac{\varepsilon_c}{d_c} V_c \quad \text{[Expression 4]}$$

Here, $d_h$ denotes the distance between the first conductor and the second conductor in the object to be measured, $d_c$ denotes the distance between the conductive plate and the grounded surface, $\varepsilon_h$ denotes the relative permittivity of the dielectric in the object to be measured, and $\varepsilon_c$ denotes the relative permittivity between the conductive plate and the grounded surface. Here, the second conductor in the object to be measured is assumed to be grounded.

In the present invention, the potential difference $V_h$ generated in the object to be measured is estimated based on an electrification charge of the object to be measured.

In general, there is a relationship shown by the following expression (5) among the charge Q accumulated between the electrodes of a capacitor, the capacity C of the capacitor, the potential difference V between the electrodes.

$$Q = CV \quad \text{[Expression 5]}$$

Here, we let the charge density per unit area, of charges accumulated between the electrodes of a capacitor be q, the area of the electrode be S, the permittivity of a dielectric of the capacitor be $\varepsilon'$, the sectional area of the dielectric forming the capacity be S', the distance between the electrodes be d, and the potential difference between the electrodes be V. Then, the relationship shown by the following expression (6) can be obtained.

$$q \cdot S = \varepsilon' \frac{S'}{d} V \quad \text{[Expression 6]}$$

In the present invention, because the area S of the electrode and the sectional area S' of the dielectric forming the capacity are equal to each other, the following expression (7) can be obtained.

$$q = \frac{\varepsilon'}{d} V \quad \text{[Expression 7]}$$

Therefore, a relationship shown by the following expression (8) holds among the distance $d_c$ between the conductive plate and the grounded surface, the permittivity $\varepsilon'_c$ between the conductive plate and the grounded surface, the potential $V_c$ of the conductive plate, and the charge density $q_c$ per unit area, of the conductive plate.

$$q_c = \frac{\varepsilon'_c}{d_c} V_c \quad \text{[Expression 8]}$$

Also, a relationship shown by the following expression (9) holds among the distance $d_h$ between the first and second conductors in the object to be measured, the permittivity $\varepsilon'_h$ of the dielectric in the object to be measured, the potential difference $V_h$ between the first second conductors, and the charge density $q_h$ per unit area, of the first conductor.

$$q_h = \frac{\varepsilon'_h}{d_h} V_h \qquad \text{[Expression 9]}$$

When the object to be measured and the conductive plate are placed in the same atmosphere, for example, the same ion atmosphere, or the same charge atmosphere, the charge density $q_c$ per unit area, of the conductive plate and the charge density $q_h$ per unit area, of the first conductive plate in the object to be measured become equal to each other.

Therefore, by eliminating $q_c$ and $q_h$ from the expressions 8 and 9, the following expression (10) can be obtained. This conversion equation makes it possible to estimate the potential difference $V_h$ between the first and second conductors in the object to be measured, based on the measured value of the potential $V_c$ of the conductive plate. Here, in the expression (10), the permittivity $\varepsilon'_c$ between the conductive plate and the grounded surface is replaced by the relative permittivity $\varepsilon_c$, and the permittivity $\varepsilon'_h$ of the dielectric is replaced by the relative permittivity $\varepsilon_h$.

$$V_h = \frac{d_h}{\varepsilon_h} \cdot \frac{\varepsilon_c}{d_c} V_c \qquad \text{[Expression 10]}$$

The charge potential evaluation device according to the present invention may produce ions by the ionizer to form an atmosphere in which the conductive plate and the grounded surface are to be disposed.

When the object to be measured is charged by the ionizer, a potential difference $V_h$ generated in the object to be measured is estimated, and based on the estimated value of the potential difference $V_h$, the ion balance of the ionizer can be evaluated.

In the present invention, the first conductor in the object to be measured may have a pair of open terminals, and when the potential difference between the first conductor and the second conductor in the object to be measured is represented by V', and $V_d$ denotes the value of the minimum potential difference V' that causes damage to the first conductor when one of the open terminals is connected to the ground after a potential difference V' is provided between the first and second conductors by charging the first conductor, the relative amount between positive ions and negative ions produced by the ionizer may be adjusted so that the $V_h$ value determined by the (c) step becomes lower than the $V_d$ value.

In the present invention, it is preferable that a plurality of sets of the grounded surfaces and the conductive plates be disposed in the same atmosphere, and that the average value of measured values of the potentials $V_c$ of all the conductive plates be assumed to be the $V_c$ value.

In the present invention, the object to be measured may be, for example, a head gimbal assembly (HGA) wherein a first conductor to which a magnetic head is connected and a load beam serving as a second conductor, are opposed to each other with an insulating foundation layer serving as a dielectric therebetween. Preferably, a protective layer constituted of an insulating material is provided over the first conductor in the HGA.

In another aspect, the present invention provides a charge potential evaluation device that includes a grounded surface; a conductive plate facing the grounded surface with a predetermined distance therebetween; a potentiometer for measuring a potential $V_c$ of the conductive plate; an input unit for inputting, in an object to be measured that has a first conductor and a second conductor opposed to each other with a dielectric therebetween, the value of the relative permittivity of the dielectric and the distance between the pair of conductors; and a conversion unit for converting the potential difference $V_h$ between the first conductor and the second conductor in the object to be measured in the same atmosphere as that of the conductive plate, by calculating the following expression (11) based on the measured value of the potential $V_c$ of the conductive plate.

$$V_h = \frac{d_h}{\varepsilon_h} \cdot \frac{\varepsilon_c}{d_c} V_c \qquad \text{[Expression 11]}$$

Here, $d_h$ denotes the distance between the first conductor and the second conductor, $d_c$ denotes the distance between the conductive plate and the grounded surface, $\varepsilon_h$ denotes the relative permittivity of the dielectric in the object to be measured, and $\varepsilon_c$ denotes the relative permittivity between the conductive plate and the grounded surface.

Thus, the charge potential evaluation device according to the present is capable of estimating the value of the potential difference $V_h$ generated in the object to be measured.

In still another aspect, the present invention provides a charge potential evaluation device that includes a grounded surface; a conductive plate facing the grounded surface with a predetermined distance therebetween; and a potentiometer for measuring a potential $V_c$ of the conductive plate. In this charge potential evaluation device, the distance $d_c$ between the conductive plate and the grounded surface, and the relative permittivity $\varepsilon_c$ between the conductive plate and the grounded surface is set, or made adjustable so that the distance $d_h$ between a first conductor and a second conductor in an object to be measured that has the first and second conductors opposed to each other with a dielectric therebetween, the relative permittivity $\varepsilon_h$ of the dielectric in the object to be measured, the distance $d_c$, and the relative permittivity $\varepsilon_c$ satisfy the relationship shown by the following expression (12), whereby the potential $V_c$ can be obtained as a potential difference $V_h$ between the first conductor and the second conductor in the object to be measured.

$$\frac{d_h}{\varepsilon_h} \cdot \frac{\varepsilon_c}{d_c} = 1 \qquad \text{[Expression 12]}$$

Thus, in the present invention, by adjusting the distance $d_c$ between the conductive plate and the grounded surface and the relative permittivity $\varepsilon_c$ therebetween, the measured value of potential $V_c$ of the conductive plate can be represented as a potential difference $V_h$ between the first and second conductors. This eliminates the need for an input unit for inputting the value of relative permittivity of the dielectric and the distance between the pair of the conductors in the object to be measured, as well as the need for a conversion unit for converting the measured value of potential $V_c$ of the conductive plate into a potential difference $V_h$ between the first and second conductors in the object to be measured.

For example, the distance $d_c$ between the conductive plate and the grounded surface may be made equal to the distance $d_h$ between the first and second conductors in the object to be measured, and the relative permittivity $\varepsilon_c$ of the region between the conductive plate and the grounded surface may be set or may be made adjustable to be equal to the relative permittivity $\epsilon_h$ of the dielectric in the object to be measured, whereby the distance $d_h$ and the relative permittivity $\epsilon_h$ in the object to be measured, and the distance $d_c$ and the relative permittivity $\epsilon_c$ in the present evaluation device can satisfy the relationship shown by the expression 12.

Alternatively, when the relative permittivity $\epsilon_c$ of the region between the conductive plate and the grounded surface is different from the relative permittivity $\epsilon_h$ of the dielectric in the object to be measured, the distance $d_c$ between the conductive plate and the grounded surface may be set or may be made adjustable so that the distance $d_h$ and the relative permittivity $\epsilon_h$ in the object to be measured, and the distance $d_c$ and the relative permittivity $\epsilon_c$ in the present evaluation device satisfy the relationship shown by the expression 12.

The charge potential evaluation device according to the present invention may comprise an ionizer that produces ions to provide a predetermined atmosphere for the conductive plate and the grounded surface.

When the object to be measured is charged by the ionizer, a potential difference $V_h$ generated in the object to be measured is estimated, and based on the estimated value of the potential difference $V_h$, the ion balance of the ionizer can be evaluated.

In the present invention, it is preferable that the first conductor in the object to be measured have a pair of open terminals, and that, when the potential difference between the first conductor and the second conductor in the object to be measured is represented by V', and $V_d$ denotes the value of the minimum potential difference V' that causes damage to the first conductor when one of the open terminals is connected to the ground after a potential difference V' is provided between the first and second conductors by charging the first conductor, the charge potential evaluation device comprise a display unit for notifying that the $V_h$ value has become lower than the $V_d$ value.

The object to be measured may be, for example, a head gimbal assembly (HGA) wherein a first conductor to which a magnetic head is connected and a load beam serving as a second conductor, are opposed to each other with an insulating foundation layer serving as a dielectric therebetween. Preferably, a protective layer constituted of an insulating material is provided over the first conductor in the HGA.

BRIEF DESCRIPTION OF THE DRAWINGS

FIG. 6A is a side view of an ionizer evaluation device according to a second embodiment of the present invention, and FIG. 6B shows a charged state of this ionizer evaluation device;

FIG. 7A is a side view of an ionizer evaluation device according to a third embodiment of the present invention, and FIG. 7B shows charged states of this ionizer evaluation device;

DESCRIPTION OF THE PREFERRED EMBODIMENTS

First, embodiments of a charge potential evaluation method according to the present invention will be described.

In an embodiment of a charge potential evaluation method, the ion balance of an ionizer is evaluated that electrically neutralizes a head gimbal assembly (HGA) in which a slider accommodating a thin film magnetic element used for record reproduction for hard disks or the like is attached to a load beam.

Figure 2:
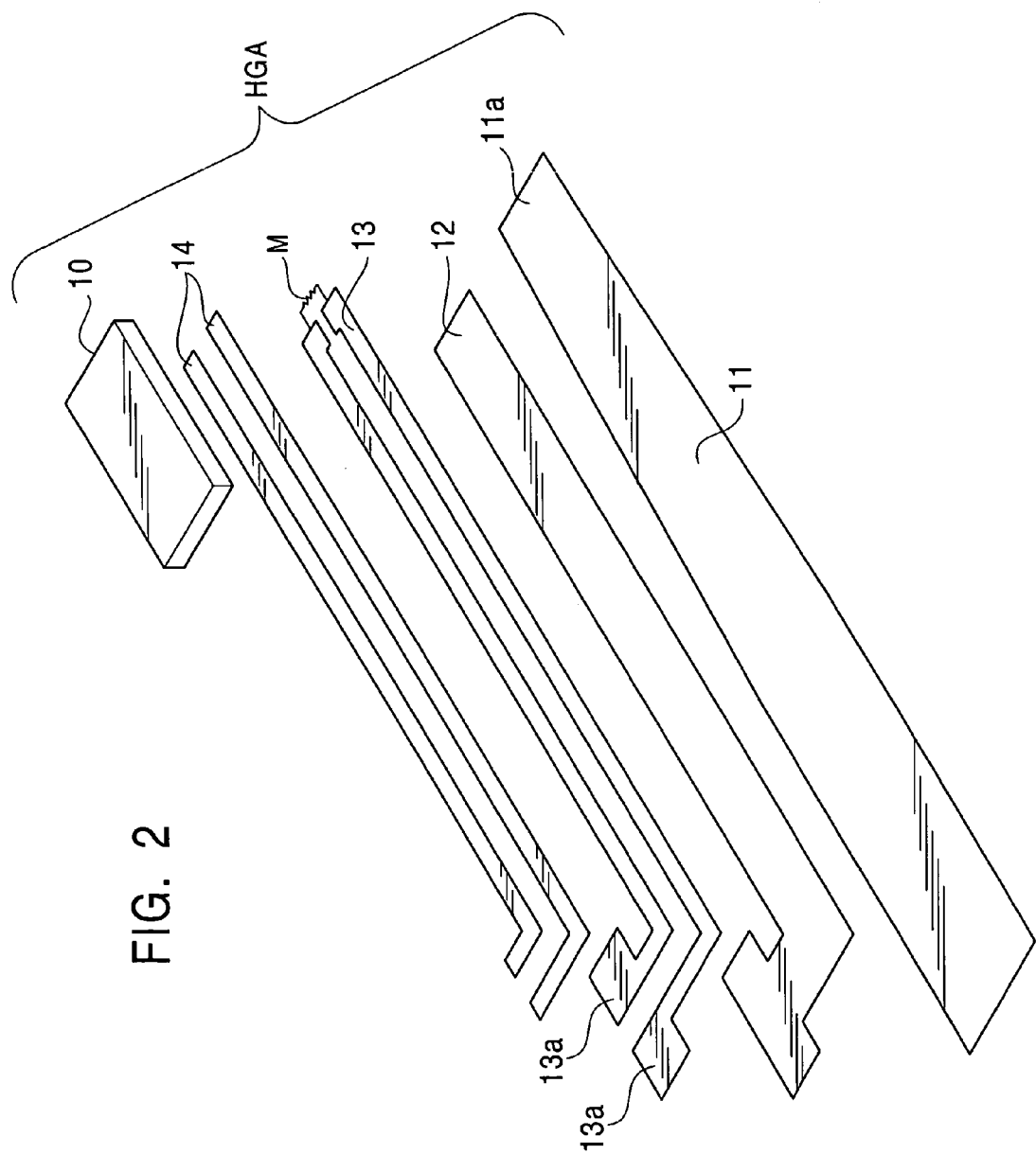
FIG. 2 is an exploded perspective view of the HGA.

This HGA is the same as that shown as the related art above, and has a structure shown in FIG. 2.

The above-described thin film magnetic element is a composite type thin film magnetic element comprising a magnetoresistive effect element for reproduction and an inductive element for recording, and it is accommodated in a slider 10 shown in FIG. 2. The slider 10 is attached to the front end 11a of a load beam 11 formed of a leaf spring via a flexure (not shown). The magnetoresistive effect element for reproduction is connected to an conductive pattern 13 constituted of a conductive material such as Cu. An insulating foundation layer 12 constituted of polyimide is provided between the conductive pattern 13 and the load beam 11. Also, a protective layer 14 constituted of polyimide is formed over the conductive pattern 13.

In FIG. 2, the conductive pattern of the inductive element is omitted from illustration. On the other hand, the magnetoresistive effect element (MR element) M is schematically illustrated in FIG. 2.

Figure 3A:
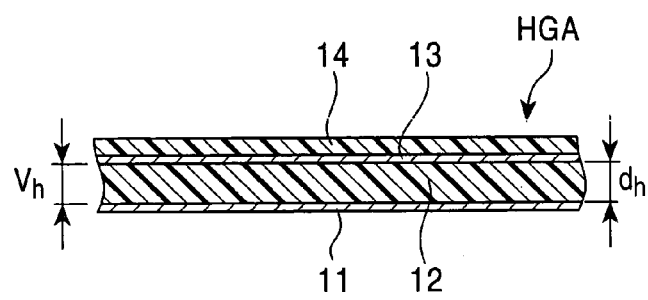
FIG. 3A is a section view of the HGA.
Figure 3B:
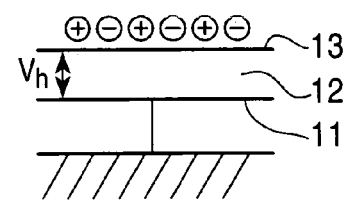
FIG. 3B shows a charged state of this HGA.

FIG. 3A is a partial sectional view of the HGA. In the HGA, a conductive pattern 13 (first conductor) and a load beam 11 (second conductor) are opposed to each other with an insulating foundation layer 12 (dielectric) therebetween, thereby forming a capacitor. As shown in FIG. 3B, when a charge is generated in the conductive pattern 13, a potential difference $V_h$ occurs between the conductive pattern 13 and the load beam 11.

According to the ionizer evaluation method of this embodiment, firstly, the value of the relative permittivity $\epsilon_h$ of the insulating foundation layer 12 in the HGA, and the distance $d_h$ between the conductive pattern 13 and the load beam 11 are acquired.

The insulating foundation layer 12, which is formed of polyimide, has a relative permittivity $\epsilon_h$ in the range of 2 to 4. The distance $d_h$ between the conductive pattern 13 and the load beam 11 is in the range of 10 to 20 µm.

Figure 1:
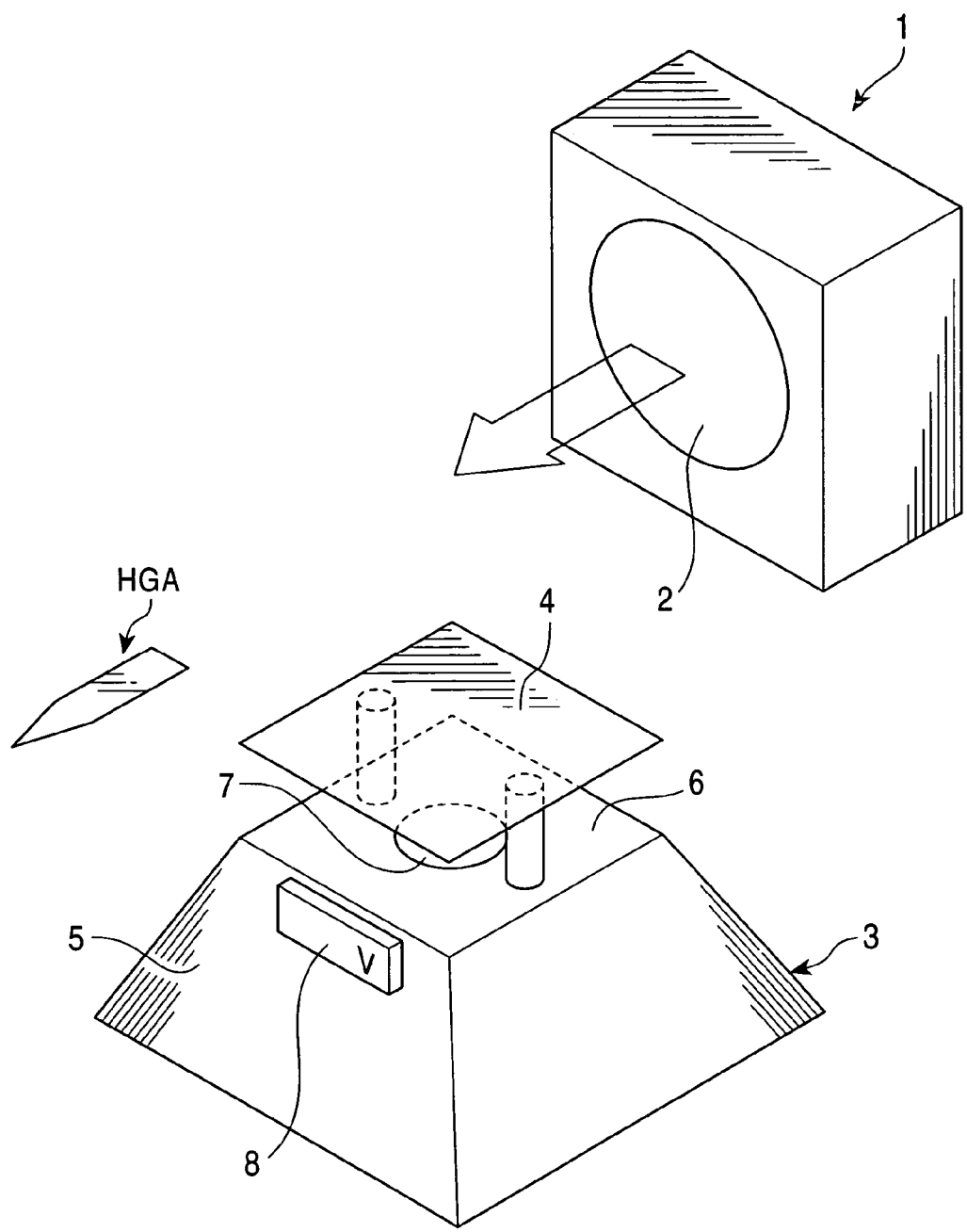
FIG. 1 is a perspective view of a head gimbal assembly (HGA), charged plate monitor (CPM), and ionizer.

Next, as shown in FIG. 1, ions flowing out of the opening 2 of the ionizer 1 are applied to the metal plate 4 (conductive plate) of the charged plate monitor (CPM) 3, serving as an ionizer evaluation device, and thereby the metal plate 4 is charged in the atmosphere of ions flowing out of the opening 2 of the ionizer 1.

The ionizer 1 evaluated according to this embodiment is the same as that shown as the related art above. The ionizer 1 is used for ionizing water, carbon dioxide and others in the atmosphere by corona discharge, ultraviolet rays, radiation or the like to thereby apply these produced ions to a place to be destaticized using a fan or the like, thereby neutralizing electric charges.

In the CPM 3, the top surface of its support 5 is a grounded surface 6 that is electrically grounded. The CPM 3 has a metal plate 4 provided in a position apart from the grounded surface 6 by a predetermined distance, and measures a potential difference between the metal plate 4 and the grounded surface 6 using a noncontact potentiometer 7. The results measured with the noncontact potentiometer 7 are displayed on a display unit 8.

The shape of the metal plate 4 is a square 15. 24 cm (6 inches) on a side. The distance between the metal plate 4 and the grounded surface 6 is defined so that the metal plate 4 and the grounded surface 6 form together a capacitor having a capacity of 20 pF with air used as its dielectric.

Figure 4A:
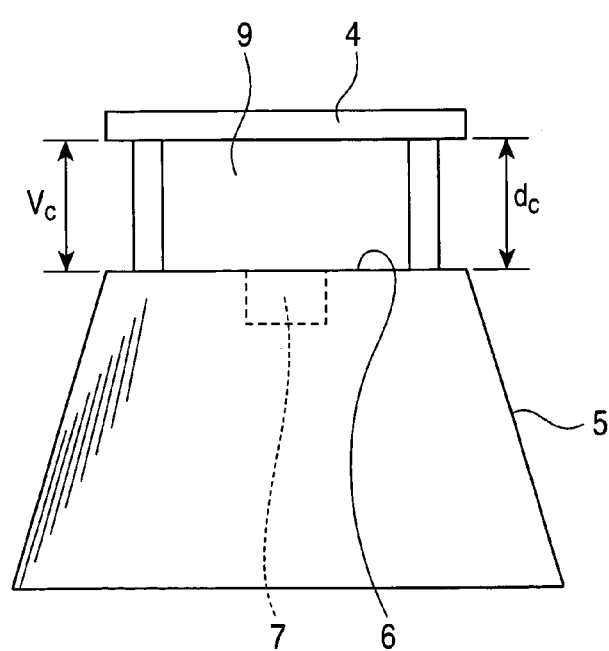
FIG. 4A is a side view of the CPM.

FIG. 4A shows a side view of the CPM 3. The distance $d_c$ between the metal plate 4 and the grounded surface 6 is approximately 2 cm. The region 9 between the metal plate 4 and the grounded surface 6 contains air alone and has a relative permittivity $\epsilon_c$ of 1.

Figure 4B:
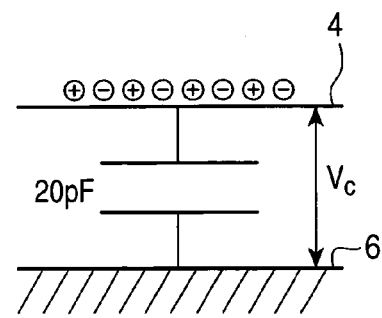
FIG. 4B shows a charged state of this CPM.

As shown in FIG. 4B, when the metal plate 4 is charged, a potential difference $V_c$ occurs in the metal plate 4, and this potential is detected by the noncontact potentiometer 7.

When positive ions and negative ions that are equal in amount to each other are present in all ions produced by the ionizer 1, the metal plate 4 is in an electrically neutralized state, and the output of the potentiometer 7 exhibits 0 volt. When the amount of positive ions is larger than that of the negative ions, the metal plate 4 is positively charged, and the output of the potentiometer 7 is positive. Conversely, when the amount of negative ions is larger than that of positive ions, the metal plate 4 is negatively charged, and the output of the potentiometer 7 is negative. The higher the ratio of either of positive ions and negative ions with respect to the other ions, that is, the worse the ion balance of the ionizer 1, the larger becomes the absolute value of output of the potentiometer 7.

The measured value of the potential $V_c$ is converted into the potential difference $V_h$ between the conductive pattern 13 and the load beam 11 in the HGA, using the following expression (13).

$$V_h = \frac{d_h}{\epsilon_h} \cdot \frac{\epsilon_c}{d_c} V_c \qquad \text{[Expression 13]}$$

Here, $d_h$ denotes the distance between the conductive pattern 13 and the load beam 11 in the HGA, $d_c$ denotes the distance between the metal plate 4 and the grounded surface 6, $\epsilon_h$ denotes the relative permittivity of the insulating foundation layer 12 in the HGA, and $\epsilon_c$ denotes the relative permittivity of the region 9 between the metal plate 4 and the grounded surface 6.

Since $d_c$=2 [cm]=20000 [µm], and $\epsilon_c$=1 in this embodiment, the following expression (14) holds when $d_h$=10 [µm], and $\epsilon_h$=2.

$$V_h = \frac{1}{4000} \cdot V_c \qquad \text{[Expression 14]}$$

Therefore, when the HGA is neutralized by the ionizer 1, the potential difference $V_h$ between the conductive pattern 13 and the load beam 11 in the HGA is estimated to become 1/4000 th as high as the measured value of the potential $V_c$ of the metal plate 4 in the CPM 3.

In an HGA step, the MR element must be controlled so as not to be subjected to a voltage of not less than the ESD withstand voltage, which is the minimum voltage that causes damage to the MR element to thereby bring about disturbances to reproduction signals. For this purpose, the surface charges of the HGA are electrically neutralized by using the ionizer, and thereby the HGA is controlled so as not to be subjected to a voltage of not less than the ESD withstand voltage.

Figure 15:
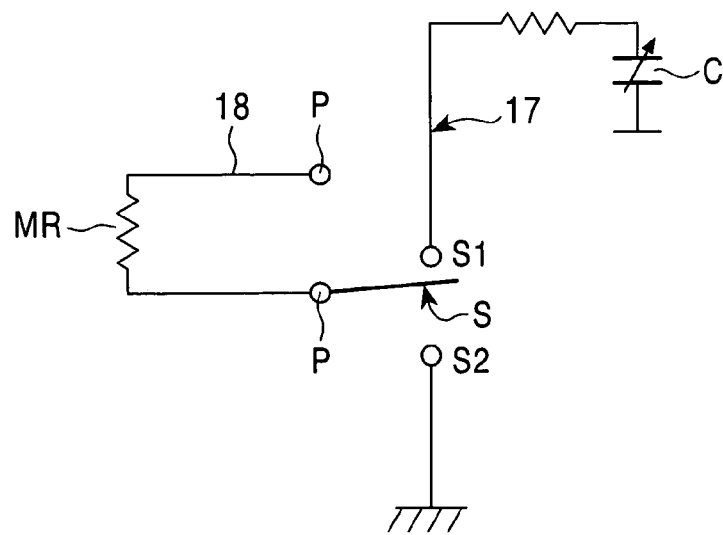
FIG. 15 is a circuit diagram of a charged device model.

As explained in the "Description of the Related Art", the resistance of the HGA against discharge currents, i.e., the ESD resistance of the HGA can be measured by using the device (charged device model; CDM) 17 shown by the circuit diagram in FIG. 15. Here, we let the potential difference between the conductive pattern 13 and the load beam 11 be V', and represent the ESD withstand voltage $V_d$ by the value of the minimum potential difference V' that causes damage to the MR element when one of pads 13a (open terminals) is connected to the ground after a potential difference V' is provided between the conductive pattern 13 and the load beam 11 by charging the conductive pattern 13. Then, the ESD withstand voltage $V_d$, for example, of a recent HGA is 3 V. Hence, if a metal makes contact with the pad in a state where the potential difference $V_h$ between the conductive pattern 13 and the load beam 11 in the HGA is over 3 V, the MR element will be destructed.

Therefore, the relative amount between positive ions and negative ions produced by the ionizer should be adjusted so that the value of the potential difference $V_h$ between the conductive pattern 13 and the load beam 11 in the HGA becomes lower than that of the above-described $V_d$ value.

Considering the foregoing together with the result shown by the expression 14, there will be a danger that, when the metal plate 4 in the CPM 3 is charged, the MR element in the HGA may be damaged in the ion atmosphere produced by the ionizer and causing the potential $V_c$ of the metal plate 4 in the CPM 3 to become 12 kV or higher.

Therefore, in order to prevent the MR element in the HGA from being damaged, the ion balance of the ionizer should be adjusted so that the potential $V_c$ of the metal plate 4 in the CPM, charged by ions produced by the ionizer becomes lower than a 4000-fold value of the ESD withstand voltage of the HGA.

According to a conventional method, in order to adjust the ion balance of the ionizer so that the value of voltage display becomes a value of not more than that of the ESD withstand voltage $V_d$ of the HGA, the relative amount between positive ions and negative ions in all ions produced by the ionizer has been required to be strictly controlled. This has disadvantageously incurred the rise in production cost of the ionizer. However, according to the present invention, the relative amount between positive ions and negative ions is not needed to be controlled so strictly as in the conventional method. This results in a reduced production cost of the ionizer.

Figure 8:
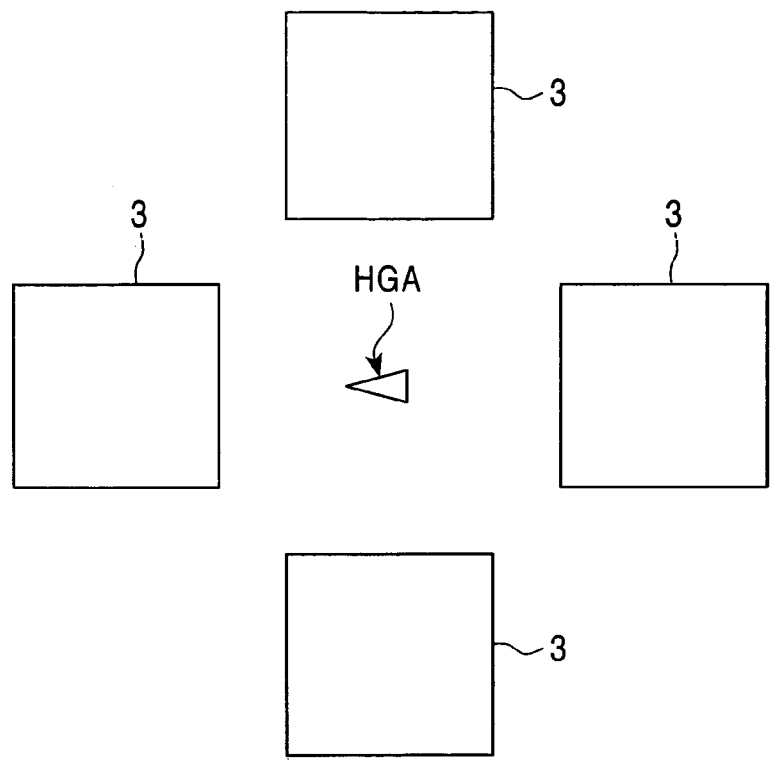
FIG. 8 is a schematic plan view explaining another embodiment of an ionizer evaluation method according to the present invention.

As shown in FIG. 8, it is preferable that a plurality of charged plate monitors (CPM; charge measuring device) 3 be disposed around the HGA, and that the average value of measured values of the potentials $V_c$ of all CPM 3 be converted into the potential difference $V_h$ between the conductive pattern 13 and the load beam 11 in the HGA, using the expression 13.

Figure 5:
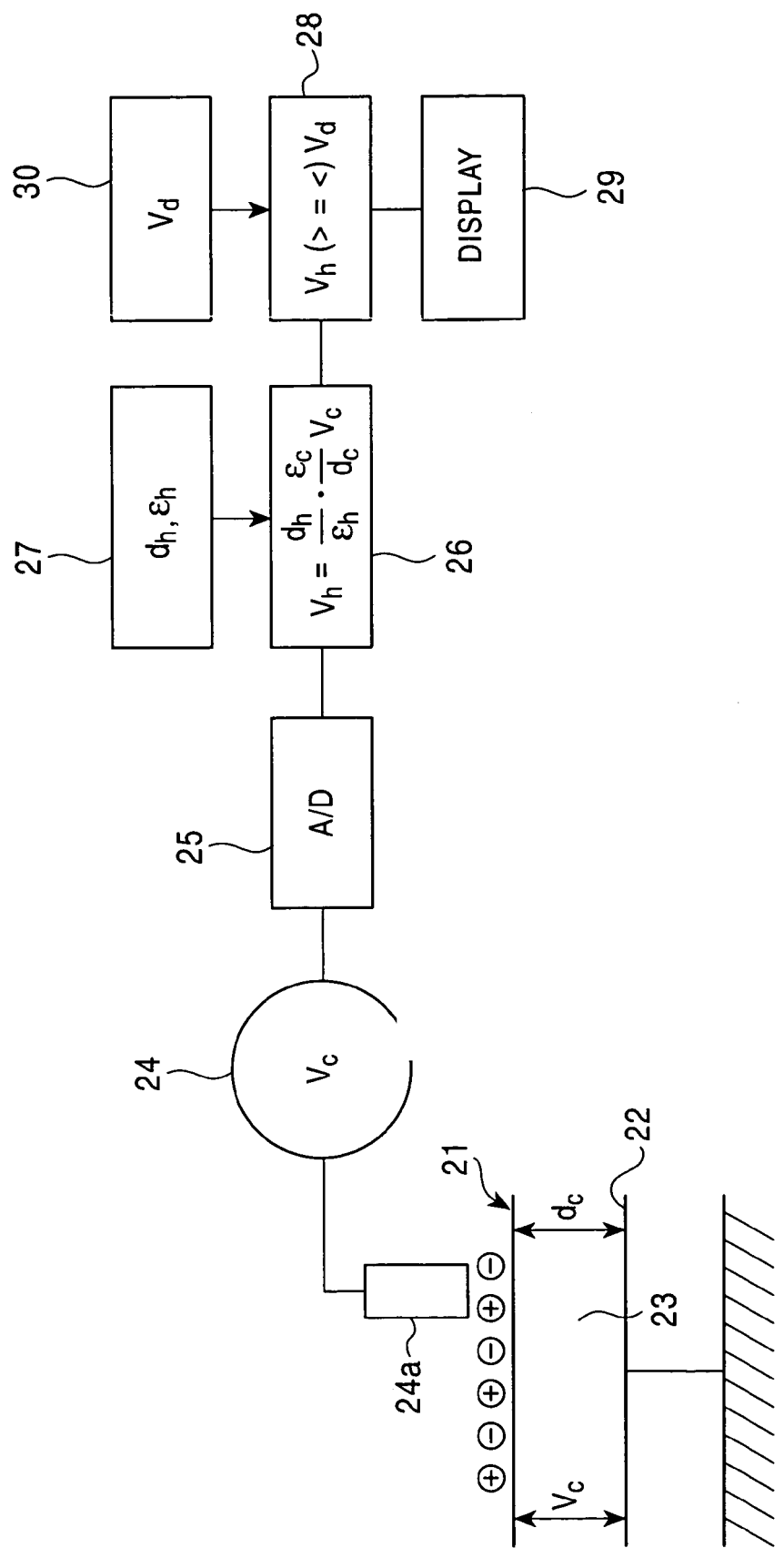
FIG. 5 is a block diagram of an ionizer evaluation device according to a first embodiment of the present invention.

Next, a first embodiment of a charge potential evaluation device according to the present invention will be described with reference to the block diagram in FIG. 5.

The use of this evaluation device allows the ion balance of the ionizer to be evaluated. The evaluation device according to this embodiment can also evaluate the ion balance of the ionizer that electrically neutralizes a head gimbal assembly (HGA) in which a slider accommodating a thin film magnetic element is attached to a load beam. The structure of the HGA is the same as that shown in FIGS. 2 and 3.

As in the case of the conventional charged plate monitor (CPM), the evaluation device according to this embodiment includes a metal plate (conductive plate) 21, a grounded surface 22 provided in a position apart from the metal plate 21 by a predetermined distance, and a potentiometer 24 for measuring a potential $V_c$ of the metal plate 21.

The evaluation device according to this embodiment further comprises an input unit 27 for inputting, in an object (HGA) to be measured that has a first conductor and a second conductor opposed to each other with a dielectric therebetween, the value $\epsilon_h$ of the relative permittivity of the dielectric (insulating foundation layer) and the distance $d_h$ between the pair of conductors (i.e., between the conductive pattern 13 and the load beam 11); and a conversion unit 26 for converting the potential difference $V_h$ between the conductors (i.e., between the conductive pattern 13 and the load beam 11) in the HGA in the same atmosphere as that of the metal plate 21, by calculating the following expression (15) based on the measured value of the potential $V_c$ of the metal plate 21.

$$V_h = \frac{d_h}{\varepsilon_h} \cdot \frac{\varepsilon_c}{d_c} V_c \qquad \text{[Expression 15]}$$

Here, $d_c$ denotes the distance between the metal plate 21 and the grounded surface 22, and $\epsilon_c$ denotes the relative permittivity between the metal plate 21 and the grounded surface 22.

The distance $d_c$ between the metal plate 21 and the grounded surface 22 is, for example, 2 cm. The region 23 between the metal plate 21 and the grounded surface 22 contains air alone and has a relative permittivity $\epsilon_c$ of 1.

The conversion unit 26 is, for example, a digital arithmetic circuit. Voltage outputs of the potentiometer 24 are converted by an A/D converter 25 into digital signals, and the digital signals are inputted into the conversion unit 26.

With the value of the minimum potential difference that causes damage to the MR element in the HGA (i.e., the ESD withstand voltage of the HGA) being represented by $V_d$, the present evaluation device includes a comparison operation circuit 28 for comparing the $V_h$ value and the $V_d$ value, and a display unit 29 for notifying that the $V_h$ value has become lower than the $V_d$ value. The display unit 29 may be one that displays the $V_h$ value and the $V_d$ value.

The comparison operation circuit 28 has also an input unit 30 for inputting the ESD withstand voltage $V_d$ of the HGA into the comparison operation circuit 28.

The external shape of the evaluation device according to this embodiment is the same as that of the charged plate monitor (CPM) 3.

In these situations, firstly, the value of the relative permittivity $\epsilon_h$ of the insulating foundation layer 12 in the HGA, and the distance $d_h$ between the conductive pattern 13 and the load beam 11 are inputted from the input unit 27. Also, the ESD withstand voltage of the HGA is inputted from the input unit 30 to the comparison operation circuit 28.

When the insulating foundation layer 12 is formed of polyimide, the relative permittivity $\epsilon_h$ thereof is, for example, 2. The distance $d_h$ between the conductive pattern 13 and the load beam 11 is, for example, 10 μm.

Next, ions flowing out of the opening 2 of the ionizer 1 shown in FIG. 1 are applied to the metal plate 21, thereby charging the metal plate 21 in the atmosphere of the above-described ions. With the metal plate 21 charged, a potential $V_c$ occurs in the metal plate 21, and this potential $V_c$ is detected by the potentiometer 24. The detection section of the potentiometer 24 is of a noncontact type.

When the measured value of the potential $V_c$ is inputted into the conversion unit 26 after being digitally converted, the potential difference $V_h$ between the conductors (i.e., the conductive pattern 13 and the load beam 11) is outputted. Then, the comparison operation circuit 28 makes a comparison between the ESD withstand voltage $V_d$ of the HGA and the $V_h$ value. When the $V_h$ value has become lower than the $V_d$ value, the display unit 29 notifies thereof.

The ionizer evaluation device according to the present invention is capable of evaluating the ion balance of the ionizer based on the potential difference generated in the object to be measured that is neutralized by the ionizer.

Next, a charge potential evaluation device according to a second embodiment of the present invention will be described with reference to FIGS. 6A and 6B.

The evaluation device E1 according to this embodiment can also evaluate the ion balance of the ionizer that electrically neutralizes a head gimbal assembly (HGA) in which a slider accommodating a thin film magnetic element is attached to a load beam. The structure of the HGA is the same as that shown in FIGS. 2 and 3.

The evaluation device according to this embodiment also includes a metal plate (conductive plate) 31, a grounded surface 32 provided in a position apart from the metal plate 31 by a predetermined distance, and a potentiometer 33 for measuring a potential $V_c$ of the metal plate 31.

Furthermore, in this embodiment, the value $\epsilon_h$ of the relative permittivity of the insulating foundation layer 12, the distance $d_h$ between the conductive pattern 13 and the load beam 11 in the HGA, the distance $d_c$ between the metal plate 31 and the grounded surface 32, and the relative permittivity $\epsilon_c$ of the region 34 between the metal plate 31 and the grounded surface 32 satisfy the relationship shown by the following expression (16).

$$\frac{d_h}{\varepsilon_h} \cdot \frac{\varepsilon_c}{d_c} = 1 \qquad \text{[Expression 16]}$$

For example, the distance $d_c$ between the metal plate 31 and the grounded surface 32 is made equal to the distance $d_h$ between the conductive pattern 13 and the load beam in the HGA, and the relative permittivity $\epsilon_c$ of the evaluation device is made equal to the relative permittivity $\epsilon_h$ of the HGA by filling the region between the metal plate 31 and the grounded surface with the same material as that of the insulating foundation layer 12 in the HGA, i.e., polyimide.

Thus, in this embodiment, by adjusting the distance $d_c$ and the relative permittivity $\epsilon_c$ in the evaluation device to the distance $d_h$ and the relative permittivity $\epsilon_h$ in the HGA, the measured value of potential $V_c$ of the metal plate 31 can be obtained as a potential difference $V_h$ between the conductive pattern 13 and the load beam 11 in the HGA. This eliminates the need for an input unit and a conversion unit, unlike the evaluation device according to the above-described first embodiment.

FIGS. 7A and 7B shows a third embodiment of an evaluation device of the present invention. In the evaluation device E2 according to this embodiment, while the relative permittivity $\epsilon_c$ of the region between the metal plate 31 and the grounded surface 32 is different from the relative permittivity $\epsilon_h$ of the insulating foundation layer 12 in the HGA, the distance $d_c$ between the metal plate 31 and the grounded surface 32 can be set so that the distance $d_h$ and the relative permittivity $\epsilon_h$ in the HGA, and the distance $d_c$ and the relative permittivity $\epsilon_c$ in the evaluation device satisfy the relationship shown by the expression 16.

As is the case with the method shown in FIG. 8, it is preferable that a plurality of the evaluation devices according to the present invention be arranged around the HGA, and that an arithmetic processing unit for calculating the average value of outputs $V_h$ of all evaluation devices be provided to use the average value obtained thereby as the potential difference between the conductive pattern 13 and the load beam 11 in the HGA.

EXAMPLES

By varying the relative amount (ion balance) between positive ions and negative ions of ions produced by the ionizer, the minimum loss of ion balance that causes damage to the MR element of the HGA, was investigated. As an HGA, one having the structure shown in FIG. 2 was used. The ESD withstand voltage determined by a CDM test, of the HGA used in the present experiments was 3 V.

Ions produced by the ionizer are applied to the metal plate of the CPM with a capacity of 20 pF to charge the metal plate, and a potential difference in accordance with the charge amount of the metal plate is detected. By the magnitude of this potential difference, the relative amount (ion balance) between positive ions and negative ions of ions produced by the ionizer is represented.

Figure 9:
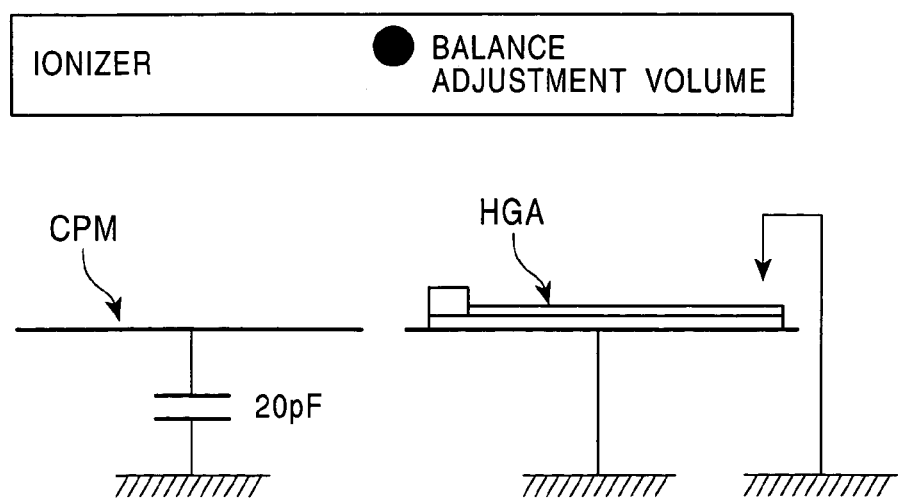
FIG. 9 is a schematic view explaining the experimental method for an example.

Firstly, as shown in FIG. 9, after the load beam in the HGA was connected to the ground, ions produced by the ionizer were applied to the HGA, thereby charging the conductive pattern connected to the MR element. Next, one of pads (open terminals) of the conductive pattern was connected to the ground, and a current was instantaneously passed through the MR element. Thereafter, a reproduction output, asymmetry, and direct current resistance of the MR element were measured. A current at the moment of discharge was also measured.

Figure 10:
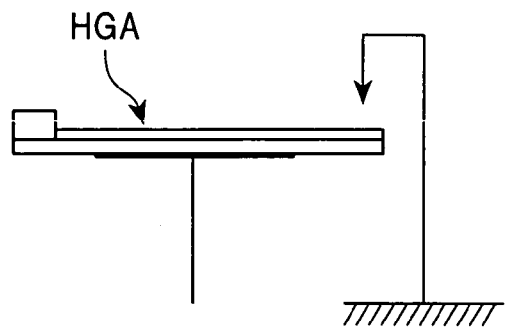
FIG. 10 is a schematic view explaining the experimental method for another example.
Figure 11:
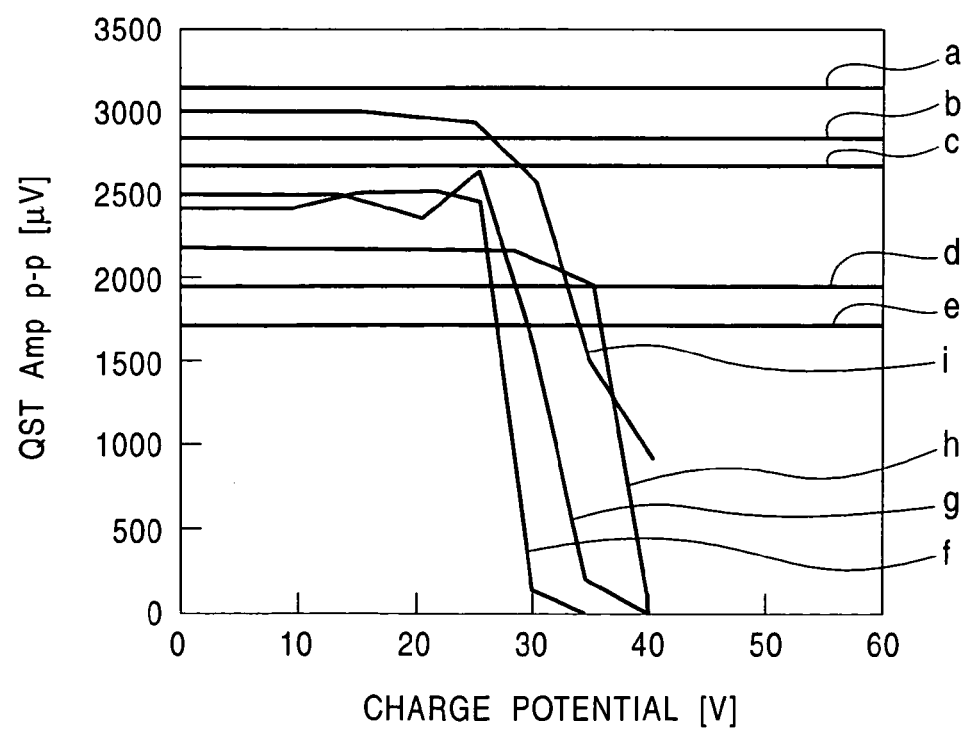
FIG. 11 is a graph showing reproduction outputs of a magnetoresistive (MR) element after being instantaneously subjected to a current, after ions produced by the ionizer shown in FIG. 5 have been applied to the HGA.
Figure 12:
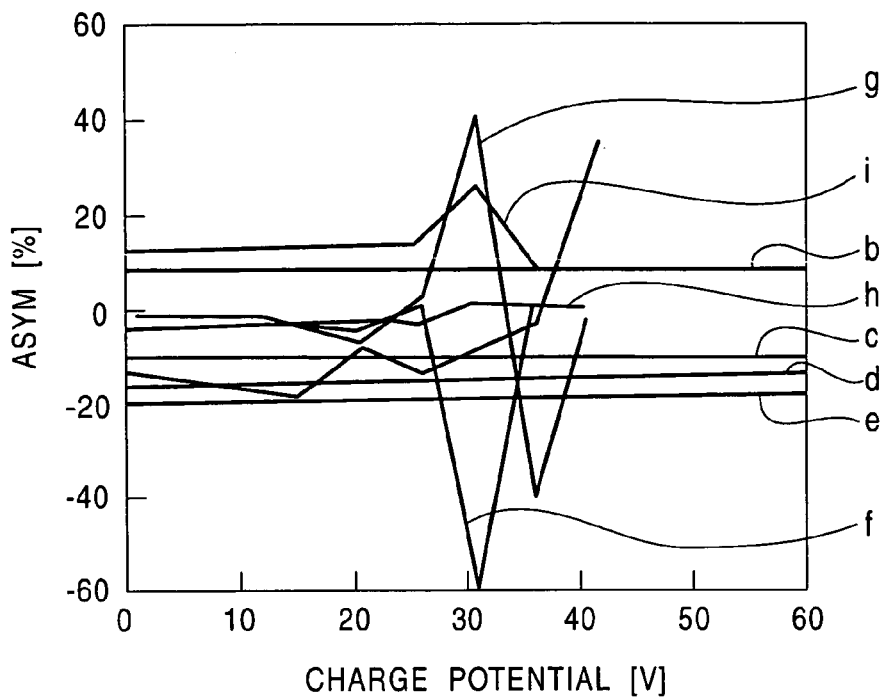
FIG. 12 is a graph showing asymmetries of the MR element after being instantaneously subjected to a current, after ions produced by the ionizer have been applied to the HGA.
Figure 13:
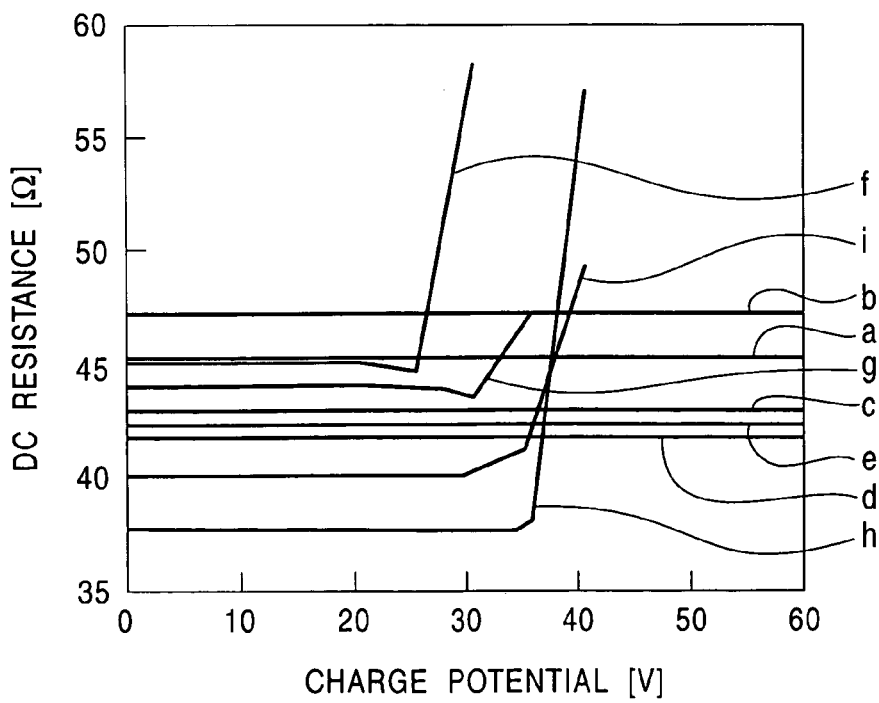
FIG. 13 is a graph showing direct current resistances of the MR element after being instantaneously subjected to a current, after ions produced by the ionizer have been applied to the HGA.
Figure 14:
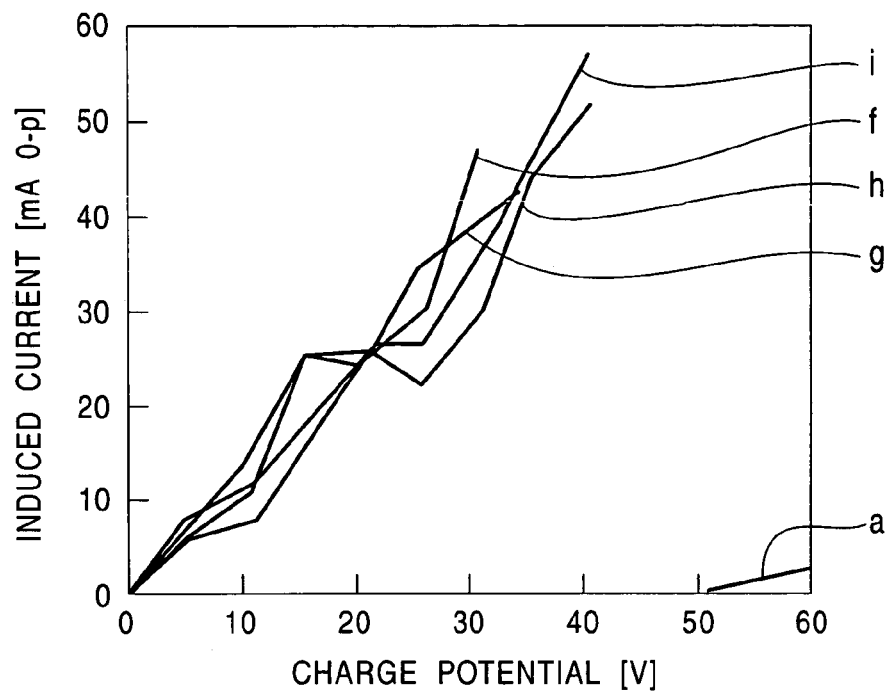
FIG. 14 is a graph showing currents instantaneously passed through the MR element, after ions produced by the ionizer have been applied to HGA.

Moreover, as shown in FIG. 10, the HGA was isolated with a support formed of an insulating material placed beneath the load beam in the HGA. After the capacity of the HGA was reduced to about 1 pF, ions produced by the ionizer were applied to the HGA, thereby charging the conductive pattern connected to the MR element. Next, one of the pads (open terminals) of the conductive pattern was connected to the ground, and a current was instantaneously passed through the MR element. Then, a reproduction output, asymmetry, and direct current resistance of the MR element, as well as a current at the moment of discharge were measured.

Also, when applying ions produced by the ionizer to the CPM having a capacity of 20 pF, the magnitude of potential of the metal plate in the CPM was varied between 0 V and 60 V by varying the ion balance of the ions produced by the ionizer.

The measured results are shown in FIGS. 11 to 14. FIGS. 11, 12, 13, and 14 are graphs of measured results, respectively, of reproduction outputs, asymmetries, direct current resistances, and currents at the moment of discharge.

In each of these graphs, symbols "a", "b", "c", "d", and "e" show results with the load beam in the HGA connected to the ground, and symbols "f", "g", "h", and "i" show results with the HGA isolated. All measurements were performed using the same HGA.

In the case where the load beam in the HGA was connected to the ground, even when the ion balance of ions produced by the ionizer was lost so that the magnitude of potential of the CPM becomes 60 V, reproduction outputs, asymmetries, and direct current resistances of the MR element did not vary at all. The current at the moment of discharge was slightly detected only when the magnitude of potential of the CPM was 60 V.

As described with reference to the above-described embodiments, the potential difference $V_h$ between the conductive pattern and the load beam in the HGA is estimated to be 1/4000th as high as the measured value of potential $V_c$ of the CPM 3. Therefore, when the magnitude of potential of the CPM is 60 V, the potential difference $V_h$ between the conductive pattern and the load beam in the HGA is considered to be 15 mV. Since the ESD withstand voltage of the HGA is 3 V, an electrostatic destruction of the MR element does not occur as a matter of course.

On the other hand, in the case where the HGA was isolated, when the ion balance of ions produced by the ionizer was lost so that the magnitude of the potential of the CPM becomes 15 V, reproduction outputs, asymmetries, and direct current resistances of the MR element suffered disturbances. That is, so-called "soft ESD" has been brought about, as can be seen from the FIGS. 11 to 13. Also, when the ion balance of ions produced by the ionizer was lost so that the magnitude of potential of the CPM becomes 25 V, reproduction outputs, asymmetries, and direct current resistances of the MR element widely varied. That is, so-called "hard ESD" (destruction of the MR element) has been brought about, as can be seen from the FIGS. 11 to 13. The current at the moment of discharge was detected as one having a magnitude in proportion to that of the potential of the CPM.

The above-described results indicates that, even though the ESD withstand voltage of the HGA is 3 V, losing the ion balance of ions produced by the ionizer so that the magnitude of the potential of the metal plate in the CPM becomes 3 V, does not necessarily cause damage to the MR element.

It has also been recognized that it is important to connect the load beam in the HGA to the ground without fail in order to prevent the damage to the MR element.

While the present invention has been described with reference to preferred embodiments, various changes and modifications may be made without departing from the scope of the present invention.

It is to be understood that the above-described embodiments is for illustrative purpose only, and that the present invention is not limited to these embodiments except as defined in the appended clams.

According to the present invention described in detail, it is possible to estimate the potential difference $V_h$ generated in an object to be measured, the potential difference $V_h$ being generated by an electrification charge of the object to be measured.

What is claimed is:

1. A charge potential evaluation method comprising:
   (a) acquiring, in an object to be measured that has a first conductor and a second conductor opposed to each other with a dielectric therebetween, a value of a relative permittivity of the dielectric and a distance between the first and second conductors;
   (b) measuring, in a predetermined atmosphere, a potential $V_c$ of a conductive plate facing a grounded surface with a predetermined distance therebetween; and
   (c) converting a potential difference $V_h$ between the first conductor and the second conductor in the object to be measured in the atmosphere, using the following expression (1), $$V_h = \frac{d_h}{\varepsilon_h} \cdot \frac{\varepsilon_c}{d_c} V_c \quad \text{[Expression 1]}$$

where $d_h$ denotes the distance between the first conductor and the second conductor in the object to be measured, $d_c$ denotes the distance between the conductive plate and the grounded surface, $\varepsilon_h$ denotes a relative permittivity of the dielectric in the object to be measured, and $\varepsilon_c$ denotes the relative permittivity between the conductive plate and the grounded surfaces, wherein ions are produced by an ionizer to form an atmosphere in which the conductive plate and the grounded surface are to be disposed.

2. The charge potential evaluation method according to claim 1, wherein the first conductor in the object to be measured has a pair of open terminals; and wherein, when the potential difference between the first conductor and the second conductor in the object to be measured is represented by V', and $V_d$ denotes a value of a minimum potential difference V' that causes damage to the first conductor when one of the open terminals is connected to the ground after a potential difference V' is provided between the first and second conductors by charging the first conductor, a relative amount of positive ions and negative ions produced by the ionizer is adjusted so that the $V_h$ value determined by (c) becomes lower than the $V_d$ value.

3. The charge potential evaluation method according to claim 1, wherein a plurality of sets of the grounded surfaces and the conductive plates are disposed in the same atmosphere, and wherein an average value of measured values of the potentials $V_c$ of all the conductive plates is assumed to be the $V_c$ value.

4. The charge potential evaluation method according to claim 1, wherein the object to be measured is a head gimbal assembly (HGA) in which a first conductor to which a magnetic head is connected and a load beam serving as a second conductor, are opposed to each other with an insulating foundation layer serving as a dielectric therebetween.

5. The charge potential evaluation method according to claim 4, wherein a protective layer constituted of an insulating material is provided over the first conductor in the head gimbal assembly (HGA).

6. A charge potential evaluation device comprising:
   a grounded surface;
   a conductive plate facing the grounded surface with a predetermined distance therebetween;
   potential measuring means for measuring a potential $V_c$ of the conductive plate;
   input means for inputting, in an object to be measured that has a first conductor and a second conductor opposed to each other with a dielectric therebetween, a value of a relative permittivity of the dielectric and a distance between the first and second conductors;
   conversion means for converting a potential difference $V_h$ between the first conductor and the second conductor in the object to be measured in the same atmosphere as that of the conductive plate, by calculating the following expression (2) based on the measured value of a potential $V_c$ of the conductive plate, $$V_h = \frac{d_h}{\varepsilon_h} \cdot \frac{\varepsilon_c}{d_c} V_c \quad \text{[Expression 2]}$$

where $d_h$ denotes a distance between the first conductor and the second conductor in the object to be measured, $d_c$ denotes the distance between the conductive plate and the grounded surface, $\varepsilon_h$ denotes the relative permittivity of the dielectric in the object to be measured, and $\varepsilon_c$ denotes a relative permittivity between the conductive plate and the grounded surface; and an ionizer that produces ions to provide a predetermined atmosphere for the conductive plate and the grounded surface.

7. The charge potential evaluation device according to claim 6, wherein the first conductor in the object to be measured has a pair of open terminals; and wherein, when the potential difference between the first conductor and the second conductor in the object to be measured is represented by V', and $V_d$ denotes the value of the minimum potential difference V' that causes damage to the first conductor when one of the open terminals is connected to the ground after a potential difference V' is provided between the first and second conductors by charging the first conductor, the charge potential evaluation device comprises display means for notifying that the $V_h$ value has become lower than the $V_d$ value.

8. The charge potential evaluation device according to claim 6, wherein the object to be measured is a head gimbal assembly (HGA) in which a first conductor to which a magnetic head is connected and a load beam serving as a second conductor, are opposed to each other with an insulating foundation layer serving as a dielectric therebetween.

9. The charge potential evaluation device according to claim 8, wherein a protective layer constituted of an insulating material is provided over the first conductor in the head gimbal assembly (HGA).

10. A charge potential evaluation device comprising:
    a grounded surface;
    a conductive plate facing the grounded surface with a predetermined distance therebetween;
    potential measuring means for measuring a potential $V_c$ of the conductive plate; and
    an ionizer that produces ions to provide a predetermined atmosphere for the conductive plate and the grounded surface, wherein the distance $d_c$ between the conductive plate and the grounded surface and a relative permittivity $\epsilon_c$ between the conductive plate and the grounded surface is set, or made adjustable so that a distance $d_h$ between a first conductor and a second conductor in an object to be measured that has the first and second conductors opposed to each other with a dielectric therebetween, a relative permittivity $\epsilon_h$ of the dielectric in the object to be measured, the distance $d_c$, and the relative permittivity $\epsilon_c$ satisfy the relationship shown by the following expression (3), $$\frac{d_h}{\epsilon_h} \cdot \frac{\epsilon_c}{d_c} = 1,\qquad \text{[Expression 3]}$$

and wherein the potential $V_c$ can thereby be obtained as a potential difference $V_h$ between the first conductor and the second conductor in the object to be measured.

11. The charge potential evaluation device according to claim 10, wherein the distance $d_c$ between the conductive plate and the grounded surface is equal to the distance $d_h$ between the first conductor and the second conductor in the object to be measured, and wherein the relative permittivity $\epsilon_c$ of the region between the conductive plate and the grounded surface is set or made adjustable to be equal to the relative permittivity $\epsilon_h$ of the dielectric in the object to be measured.

12. The charge potential evaluation device according to claim 10, wherein the relative permittivity $\epsilon_c$ of the region between the conductive plate and the grounded surface is different from the relative permittivity $\epsilon_h$ of the dielectric in the object to be measured, and wherein the distance $d_c$ between the conductive plate and the grounded surface is set or adjusted so that the expression 3 can be satisfied.

13. The charge potential evaluation device according to claim 10, wherein the first conductor in the object to be measured has a pair of open terminals; and wherein, when the potential difference between the first conductor and the second conductor in the object to be measured is represented by V', and $V_d$ denotes the value of the minimum potential difference V' that causes damage to the first conductor when one of the open terminals is connected to the ground after a potential difference V' is provided between the first and second conductors by charging the first conductor, the charge potential evaluation device comprises display means for notifying that the $V_h$ value has become lower than the $V_d$ value.

14. The charge potential evaluation device according to claim 10, wherein the object to be measured is a head gimbal assembly (HGA) in which a first conductor to which a magnetic head is connected and a load beam serving as a second conductor, are opposed to each other with an insulating foundation layer serving as a dielectric therebetween.

15. The charge potential evaluation device according to claim 14, wherein a protective layer constituted of an insulating material is provided over the first conductor in the head gimbal assembly (HGA).

16. A charge potential evaluation method comprising:

(a) acquiring, in an object to be measured that has a first conductor and a second conductor opposed to each other with a dielectric therebetween, a value of a relative permittivity of the dielectric and a distance between the first and second conductors;

(b) measuring, in a predetermined atmosphere, a potential $V_c$ of a conductive plate facing a grounded surface with a predetermined distance therebetween; and (c) converting a potential difference $V_h$ between the first conductor and the second conductor in the object to be measured in the atmosphere, using the following expression (1), $$V_h = \frac{d_h}{\epsilon_h} \cdot \frac{\epsilon_c}{d_c} V_c \qquad \text{[Expression 1]}$$

where $d_h$ denotes the distance between the first conductor and the second conductor in the object to be measured, $d_c$ denotes the distance between the conductive plate and the grounded surface, $\epsilon_h$ denotes a relative permittivity of the dielectric in the object to be measured, and $\epsilon_c$ denotes the relative permittivity between the conductive plate and the grounded surface, wherein the object to be measured is a head gimbal assembly (HGA) in which a first conductor to which a magnetic head is connected and a load beam serving as a second conductor, are opposed to each other with an insulating foundation layer serving as a dielectric therebetween.

17. The charge potential evaluation method according to claim 16, wherein a protective layer constituted of an insulating material is provided over the first conductor in the head gimbal assembly (HGA).

18. A charge potential evaluation device comprising:

a grounded surface;

a conductive plate facing the grounded surface with a predetermined distance therebetween;

potential measuring means for measuring a potential $V_c$ of the conductive plate;

input means for inputting, in an object to be measured that has a first conductor and a second conductor opposed to each other with a dielectric therebetween, a value of a relative permittivity of the dielectric and a distance between the first and second conductors; and conversion means for converting a potential difference $V_h$ between the first conductor and the second conductor in the object to be measured in the same atmosphere as that of the conductive plate, by calculating the following expression (2) based on the measured value of a potential $V_c$ of the conductive plate, $$V_h = \frac{d_h}{\epsilon_h} \cdot \frac{\epsilon_c}{d_c} V_c \qquad \text{[Expression 2]}$$

where $d_h$ denotes a distance between the first conductor and the second conductor in the object to be measured, $d_c$ denotes the distance between the conductive plate and the grounded surface, $\epsilon_h$ denotes the relative permittivity of the dielectric in the object to be measured, and $\epsilon_c$ denotes a relative permittivity between the conductive plate and the grounded surface, wherein the object to be measured is a head gimbal assembly (HGA) in which a first conductor to which a magnetic head is connected and a load beam serving as a second conductor, are opposed to each other with an insulating foundation layer serving as a dielectric therebetween.

19. The charge potential evaluation device according to claim 18, wherein a protective layer constituted of an insulating material is provided over the first conductor in the head gimbal assembly (HGA).

20. A charge potential evaluation device comprising:

a grounded surface;

a conductive plate facing the grounded surface with a predetermined distance therebetween; and potential measuring means for measuring a potential $V_c$ of the conductive plate, wherein the distance $d_c$ between the conductive plate and the grounded surface and a relative permittivity $\epsilon_c$ between the conductive plate and the grounded surface is set, or made adjustable so that a distance $d_h$ between a first conductor and a second conductor in an object to be measured that has the first and second conductors opposed to each other with a dielectric therebetween, a relative permittivity $\epsilon_h$ of the dielectric in the object to be measured, the distance $d_c$, and the relative permittivity $\epsilon_c$ satisfy the relationship shown by the following expression (3), $$\frac{d_h}{\epsilon_h} \cdot \frac{\epsilon_c}{d_c} = 1, \qquad \text{[Expression 3]}$$

wherein the potential $V_c$ can thereby be obtained as a potential difference $V_h$ between the first conductor and the second conductor in the object to be measured, and wherein the object to be measured is a head gimbal assembly (HGA) in which a first conductor to which a magnetic head is connected and a load beam serving as a second conductor, are opposed to each other with an insulating foundation layer serving as a dielectric therebetween.

21. The charge potential evaluation device according to claim 20, wherein a protective layer constituted of an insulating material is provided over the first conductor in the head gimbal assembly (HGA).

* * * * *